United States Patent
Chidambarrao et al.

(10) Patent No.: US 9,646,124 B2
(45) Date of Patent: May 9, 2017

(54) MODELING TRANSISTOR PERFORMANCE CONSIDERING NON-UNIFORM LOCAL LAYOUT EFFECTS

(71) Applicant: International Business Machines Corporation, Armonk, NY (US)

(72) Inventors: Dureseti Chidambarrao, Weston, CT (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 44 days.

(21) Appl. No.: 14/748,643

(22) Filed: Jun. 24, 2015

(65) Prior Publication Data

US 2016/0378888 A1 Dec. 29, 2016

(51) Int. Cl.
*G06F 9/455* (2006.01)
*G06F 17/50* (2006.01)

(52) U.S. Cl.
CPC .................. *G06F 17/505* (2013.01)

(58) Field of Classification Search
CPC ............. G06F 17/5036; G06F 17/5068; G06F 17/5081; G06F 17/5009; G06F 17/50; G06F 17/5018; G06F 17/5022; G06F 17/5072; G06F 2217/12; G06F 2217/16; G06F 2217/82
See application file for complete search history.

(56) References Cited

U.S. PATENT DOCUMENTS

| | | | |
|---|---|---|---|
| 7,337,420 B2 | 2/2008 | Chidambarrao et al. | |
| 7,627,837 B2 | 12/2009 | Zhang | |
| 8,745,571 B2 | 6/2014 | Li et al. | |
| 2006/0142987 A1* | 6/2006 | Ishizu | G06F 17/5036 703/14 |
| 2009/0007053 A1 | 1/2009 | Kim | |

(Continued)

OTHER PUBLICATIONS

Su et al., "A Scaleable Model for STI Mechanical Stress Effect on Layout Dependence of MOS Electrical Characteristics", IEEE Custom Integrated Circuits Conference, 2003, pp. 245-248.

(Continued)

*Primary Examiner* — Nha Nguyen
(74) *Attorney, Agent, or Firm* — Gibb & Riley, LLC; Jennifer M. Anda

(57) ABSTRACT

In a system and method, a design layout defines a transistor, a local layout effect (LLE)-inducing feature and shapes, including a non-uniform shape, that illustrate separation between the channel region and LLE-inducing feature. Layout information for the non-uniform shape, including minimum and maximum distances between the channel region and LLE-inducing feature, is extracted. Based on this layout information, a first width of a first portion of the non-uniform shape, which is associated with the maximum distance, and a second width of a second portion of the non-uniform shape, which is associated with the minimum distance, are derived and used to calculate the non-uniform shape's contribution to the value of a model parameter adjuster. The value of the model parameter adjuster is then calculated based on a sum of contributions from all shapes and used to generate a compact model for modeling a performance attribute of the transistor within the IC.

20 Claims, 6 Drawing Sheets

(56) References Cited

U.S. PATENT DOCUMENTS

| | | |
|---|---|---|
| 2012/0143569 A1 | 6/2012 | Olubuyide et al. |
| 2012/0227016 A1* | 9/2012 | Ishizu ................ G06F 17/5036 716/52 |
| 2014/0089877 A1 | 3/2014 | Salem et al. |

OTHER PUBLICATIONS

Faricelli et al., "Layout-Dependent Proximity Effects in Deep Nanoscale CMOS", Custom Integrated Circuits Conference, IEEE, 2010, pp. 1-8.

Borges, R. Moroz, V & Xu, X., Strain Engineering and Layout Context Variability at 45 nm. Semiconductors International, available at : http://www.highbeam.com/dod/1G1-170925586.html: See abstract, Nov. 1, 2007.

* cited by examiner

MODELING TRANSISTOR PERFORMANCE CONSIDERING NON-UNIFORM LOCAL LAYOUT EFFECTS

FIELD OF THE INVENTION

The embodiments disclosed herein relate to local layout effects and, more particularly, to embodiments of a system, a method and a computer program product for modeling transistor performance considering non-uniform local layout effects (LLEs) and the efficiency and performance of the modeling software.

BACKGROUND

In integrated circuit (IC) design, transistor performance and, particularly, field effect transistor (FET) performance can vary from a nominal performance as a function of the FET's proximity to certain adjacent features. This phenomenon is referred to as the local layout effect (LLE) and adjacent features that impact a FET's performance are referred to herein LLE-inducing features. Exemplary LLE-inducing features include, but are not limited to, strain-inducing features (i.e., features that impart strain on the channel region of the FET). Strain-inducing features can include, for example, stress layer(s), which are specifically incorporated into the design layout for the purpose of imparting strain in order to optimize FET performance. This technique is referred to as strain engineering. Such stress layer(s) can overlay the entire FET (i.e., can be stress overlayers), can be embedded within each of the source/drain regions of the FET (i.e., can be embedded stress layers), can be above each of the source/drain regions of the FET, etc. Other strain-inducing features can include, for example, isolation regions, spacers, other devices, or other structural components that are incorporated into the design layout for non-stress related purposes, but which by reason of their placement impart strain. Other LLE-inducing features can include features, such as well regions or other dopant implant regions, which exhibit dopant scattering. Still other LLE-inducing features include features that exhibit structural variations due to lithographic patterning variations (e.g., features that exhibit rounded corners as compared to squared corners indicated in the design layout because of variations that occur during lithographic patterning of the features). In any case, LLE-inducing features can alter model parameter(s) of the FET and can thereby alter performance attribute(s) of the FET. Exemplary model parameters that can vary due to LLEs include, but are not limited to, charge carrier mobility (u0), saturation threshold voltage (Vtsat), carrier saturation velocity, drain-induced barrier lowering (DIBL) and series resistance. Exemplary performance attributes that can vary as a function of variations in such model parameters can include, but are not limited to, effective drive current (Ieff), linear drain current (Idlin), and saturation drain current (Idsat). Since the LLE will vary as a function of the distance(s) between the LLE-inducing feature(s) and the FET, the model parameters for essentially identical FETs and, thereby the performance attributes associated with those FETs will vary as a function of FET placement within the design layout. Modeling the local layout effect (LLE) of a LLE-inducing feature on a performance attribute of a FET is complex and becomes even more complex when the LLE-inducing feature has a nonlinear edge (e.g., a serrated or jagged edge) such that different areas of the FET channel region are separated from the edge by different distances and, thereby such that the LLE across the FET channel region is non-uniform.

SUMMARY

More particularly, disclosed herein is a computer system for modeling a performance attribute of a transistor within an integrated circuit (IC) and for performing local layout effect (LLE)-aware redesign of the IC, as necessary.

The system can comprise at least one memory. The memory can store a base model and a design layout.

The base model can be for modeling the performance attribute of the transistor based on the design of that transistor. The base model can comprise at least one model parameter and, for each model parameter, a model parameter adjuster.

The design layout can be for the IC and can define, within the design for the IC, placement of the transistor, placement of at least one local layout effect (LLE)-inducing feature (e.g., a strain-inducing feature or other LLE-inducing feature) adjacent to the transistor channel region and shapes, including at least one non-uniform shape, wherein each shape extends between a corresponding side of the channel region of the transistor and an edge of the LLE-inducing feature. For the non-uniform shape specifically, the side of the channel region can be essentially linear and the edge of the LLE-inducing feature can be non-linear such that different points on the edge of the LLE-inducing feature are separated from the side of the channel region by different distances, respectively.

The system can further comprise at least one processor. The processor can access the base model and the design layout from the memory and can perform the following process steps.

The processor can extract, from the design layout, various different pieces of layout information associated with the shapes that extend between the channel region and the LLE-inducing feature and, based on this layout information, can determine the corresponding contributions of those shapes to the value of the model parameter adjuster for the model parameter in the base model. For the non-uniform shape specifically, the processor can determine the contribution of the non-uniform shape to the value of the model parameter adjuster by extracting, from the design layout, a minimum distance between the side of the channel region and the edge of the LLE-inducing feature, a maximum distance between the side and the edge, a maximum width of the non-uniform shape, and the area of the non-uniform shape. Then, based on the extracted layout information, the processor can determine a first width of a first portion of the non-uniform shape, which is associated with the maximum distance, and a second width of a second portion of the non-uniform shape, which is associated with the minimum distance. Then, based on the maximum distance between the side of the channel region and the edge of the LLE-inducing feature, the first width of the first portion of the non-uniform shape, the minimum distance between the side of the channel region and the edge of the LLE-inducing feature, and the second width of the second portion of the non-uniform shape, the processor can calculate the corresponding contribution of the non-uniform shape to the value for the model parameter adjuster.

The processor can calculate the value for the model parameter adjuster for the model parameter in the base model based on the sum of contributions from each of the shapes, including the non-uniform shape.

The processor can generate a compact model that models the performance attribute of the transistor within the IC. Specifically, the processor can generate the compact model using the base model and setting the value of the model parameter adjuster therein to the previously calculated model parameter adjuster value.

The processor can then perform local layout effect (LLE)-aware redesign of the IC, as necessary, based on the compact model.

Also disclosed herein are embodiments of a method for modeling a performance attribute of a transistor within an integrated circuit (IC) and performing local layout effect (LLE)-aware redesign of the IC, as necessary.

The method can comprise storing, in a memory, a base model and a design layout.

The base model can be for modeling the performance attribute of the transistor based on the design of that transistor. The base model can comprise a model parameter and a model parameter adjuster for the model parameter.

The design layout can be for the IC and can define, within the design for the IC, placement of the transistor, placement of at least local layout effect (LLE)-inducing feature (e.g., a strain-inducing feature or other LLE-inducing feature) adjacent to the transistor channel region and shapes, including at least one non-uniform shape, wherein each shape extends between a corresponding side of the channel region of the transistor and an edge of the LLE-inducing feature. For the non-uniform shape specifically, the side of the channel region can be essentially linear and the edge of the LLE-inducing feature can be non-linear such that different points on the edge of the LLE-inducing feature are separated from the side of the channel region by different distances, respectively.

The method can further comprises extracting, from the design layout, various different pieces of layout information associated with the shapes that extend between the channel region and the LLE-inducing feature in the design layout and, based on this layout information, determining the corresponding contributions of the shapes to the value of the model parameter adjuster for the model parameter in the base model. For the non-uniform shape specifically, the contribution of the non-uniform shape to the value of the model parameter adjuster can be determined by extracting, from the design layout, a minimum distance between the side of the channel region and the edge of the LLE-inducing feature, a maximum distance between the side and the edge, a maximum width of the non-uniform shape, and the area of the non-uniform shape. Then, based on the previously extracted layout information, a first width of a first portion of the non-uniform shape, which is associated with the maximum distance, and a second width of a second portion of the non-uniform shape, which is associated with the minimum distance, can be determined. Then, based on the maximum distance between the side of the channel region and the edge of the LLE-inducing feature, the first width of the first portion of the non-uniform shape, the minimum distance between the side of the channel region and the edge of the LLE-inducing feature, and the second width of the second portion of the non-uniform shape, the corresponding contribution of the non-uniform shape to the value for the model parameter adjuster can be calculated.

The method can further comprise calculating the value for the model parameter adjuster for the model parameter in the base model based on the sum of contributions from each of the shapes.

The method can further comprise generating a compact model that models the performance attribute of the transistor within the IC. Specifically, the compact model can be generated using the base model and setting the value of the model parameter adjuster for the model parameter within the base model to the previously calculated model parameter adjuster value.

The method can further comprise performing local layout effect (LLE)-aware redesign of the IC, as necessary, based on the compact model.

Also disclosed herein are embodiments of a computer program product. This computer program product can comprise a computer readable storage medium having program instructions embodied therewith. The program instructions can be executable by a processor to cause the processor to perform the above-described method for modeling a performance attribute of a transistor within an integrated circuit (IC) and performing layout-aware redesign, as necessary.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
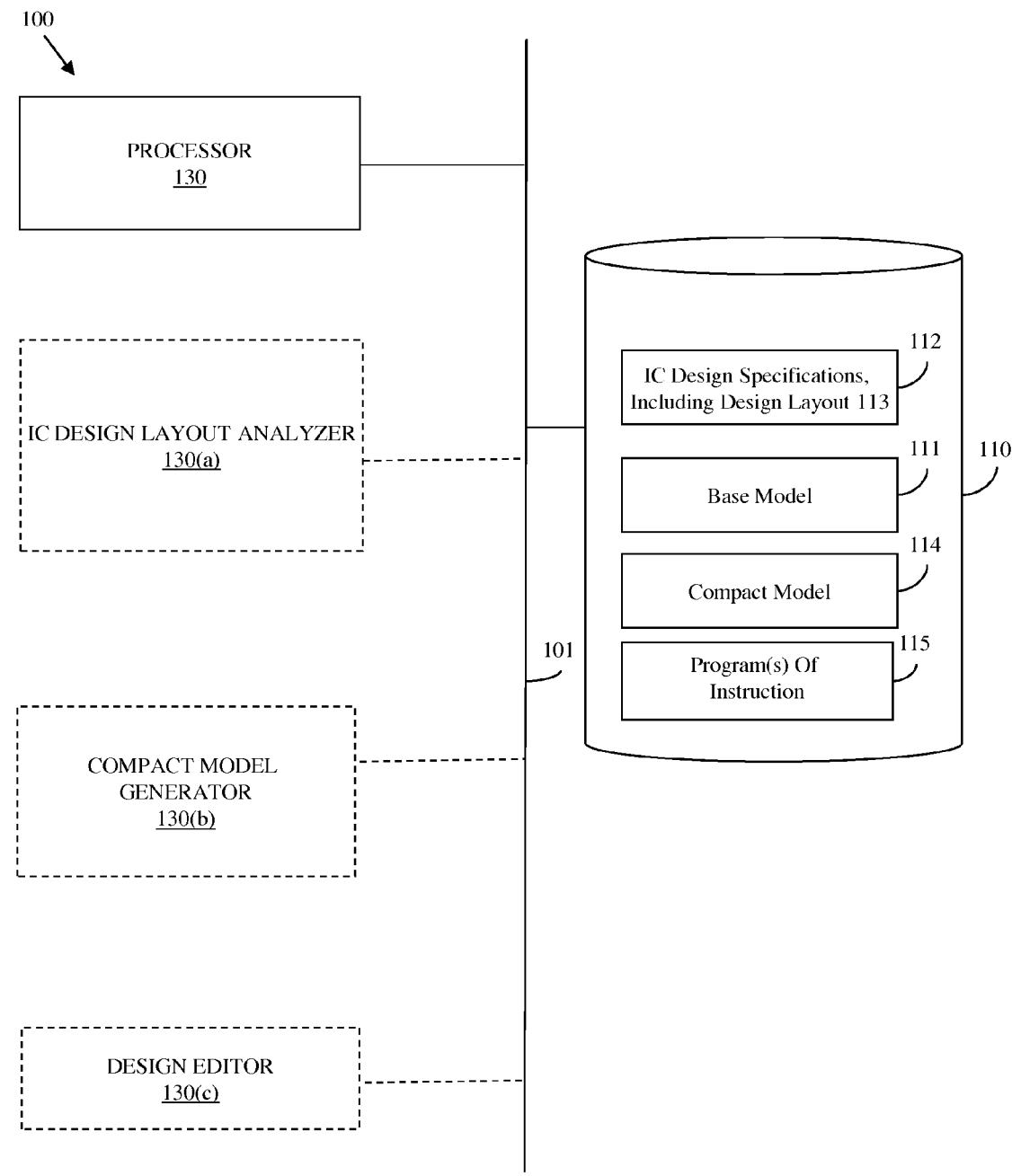
FIG. 1 is a schematic diagram illustrating a system for modeling a performance attribute of a transistor within an integrated circuit (IC) and for performing layout-aware redesign.

As mentioned above, in integrated circuit (IC) design, transistor performance and, particularly, field effect transistor (FET) performance can vary from a nominal performance as a function of the FET's proximity to certain adjacent features. This phenomenon is referred to as the local layout effect (LLE) and adjacent features that impact a FET's performance are referred to herein LLE-inducing features. Exemplary LLE-inducing features include, but are not limited to, strain-inducing features (i.e., features that impart strain on the channel region of the FET). Strain-inducing features can include, for example, stress layer(s), which are specifically incorporated into the design layout for the purpose of imparting strain in order to optimize FET performance. This technique is referred to as strain engineering. Such stress layer(s) can overlay the entire FET (i.e., can be stress overlayers), can be embedded within each of the source/drain regions of the FET (i.e., can be embedded stress layers), can be above each of the source/drain regions of the FET, etc. Other strain-inducing features can include, for example, isolation regions, spacers, other devices, or other structural components that are incorporated into the design layout for non-stress related purposes, but which by reason of their placement impart strain. Other LLE-inducing features can include features, such as well regions or other dopant implant regions, which exhibit dopant scattering. Still other LLE-inducing features include features that exhibit structural variations due to lithographic patterning variations (e.g., features that exhibit rounded corners as compared to squared corners indicated in the design layout because of variations that occur during lithographic patterning of the features). In any case, LLE-inducing features can alter model parameter(s) of the FET and can thereby alter performance attribute(s) of the FET. Exemplary model parameters that can vary due to LLEs include, but are not limited to, charge carrier mobility (u0), saturation threshold voltage (Vtsat), carrier saturation velocity, drain-induced barrier lowering (DIBL) and series resistance. Exemplary performance attributes that can vary as a function of variations in such model parameters can include, but are not limited to, effective drive current (Ieff), linear drain current (Idlin), and saturation drain current (Idsat). Since the LLE will vary as a function of the distance(s) between the LLE-inducing feature(s) and the FET, the model parameters for essentially identical FETs and, thereby the performance attributes associated with those FETs will vary as a function of FET placement within the design layout. Modeling the local layout effect (LLE) of a LLE-inducing feature on a performance attribute of a FET is complex and becomes even more complex when the LLE-inducing feature has a nonlinear edge (e.g., a serrated or jagged edge) such that different areas of the FET channel region are separated from the edge by different distances and, thereby such that the LLE across the FET channel region is non-uniform.

Typically, the local layout effect (LLE) of a LLE-inducing feature (e.g., a strain-inducing feature or other LLE-inducing feature) on a performance attribute (e.g., effective drive current (Ieff), linear drain current (Idlin), and saturation drain current (Idsat), etc.) of a FET within a circuit design layout will be modeled based on layout information provided by a layout extraction program. That is, layout information is extracted from the design layout and used to define a model parameter adjuster for a model parameter that impacts performance. The model parameter adjuster is then incorporated into the equations of a base model for the performance attribute of the FET in order to generate a compact model that accounts for the LLE on the performance attribute of the FET. For example, the model parameter adjuster can comprise mobility multiplier that alters the mobility (u0) model parameter in the compact model or a threshold voltage adder that alters the saturation threshold voltage (Vtsat) model parameter in the compact model. In any case, when the shape of the edge of the LLE-inducing feature is non-linear (e.g., serrated or jagged) such that the LLE across the FET channel region is non-uniform, the model parameter adjuster for the model parameter at issue (e.g., the mobility multiplier (u0 multiplier) for mobility or the threshold voltage adder (Vt adder) for saturation threshold voltage (Vtsat)) is typically defined based solely on a single average distance between the FET channel region and the non-linear edge of the LLE-inducing feature at issue. However, this technique for defining the model parameter adjuster does not account for functional sensitivities associated with different distances between the non-linear edge of the LLE-inducing feature and the FET channel region. That is, this technique does not account for the fact that the LLE may be exponentially stronger in areas where the non-linear edge of the adjacent LLE-inducing feature is closest to FET channel region and vice versa.

In view of the foregoing, disclosed herein are embodiments of a system, a method and a computer program product. In the embodiments, a design layout of an integrated circuit (IC) can define a transistor, a local layout effect (LLE)-inducing feature (e.g., a strain-inducing feature or other LLE-inducing feature) adjacent to the transistor channel region and shapes, including at least one non-uniform shape, that illustrate separation between the channel region and the LLE-inducing feature. Layout information associated with the non-uniform shape, including minimum and maximum distances between the channel region and the LLE-inducing feature, can be extracted from the design layout. Based on this layout information, a first width of a first portion of the non-uniform shape, which is associated with the maximum distance, and a second width of a second portion of the non-uniform shape, which is associated with the minimum distance, can be derived and used to calculate the contribution of that non-uniform shape to the value for a model parameter adjuster for a model parameter in a base model. The value of the model parameter adjuster can be calculated based on the sum of the contributions from each of the shapes. A compact model that models the performance attribute of the transistor within the IC can then be generated using the base model with the model parameter adjuster set to the previously calculated value. Modeling the performance attribute in this manner accounts for the fact that the local layout effect (LLE) on the transistor channel region may be exponentially stronger in areas where the LLE-inducing feature is closest to the transistor channel region and vice versa. The compact model can then be used to perform LLE-aware redesign of the IC, as necessary.

More particularly, referring to FIG. 1, disclosed herein is a computer system 100 for modeling a performance attribute of a transistor within an integrated circuit (IC) and performing layout-aware redesign, as necessary.

The computer system 100 can comprise at least one memory 110 (e.g., at least one computer readable storage medium, such as a computer readable storage device) and at least one processor (e.g., 130 or 130(a)-(c), see detailed discussion below). Components of the system 100, including the processor(s) and memory(ies), can be interconnected over a system bus 101, as illustrated. Alternatively, any one or more of the components of the system 100 can communicate with any other component over a wired or wireless network.

The memory 110 can store program(s) of instruction 115 for performing the various processes described in detail below. The memory 110 can further store a base model 111 for a transistor (e.g., a field effect transistor (FET)) and design specifications 112 for an integrated circuit (IC) that incorporates the transistor.

The base model 111 can model a performance attribute of the transistor. The performance attribute can comprise, for example, effective drive current (Ieff), linear drain current (Idlin), saturation drain current (Idsat) or any other performance attribute of a transistor that may be impacted by LLEs. The base model 111 can comprise at least one model parameter and can indicate that changes in the value of this model parameter can result in corresponding changes in the value of the performance attribute. Exemplary model parameters that can impact a performance attribute, such as effective drive current (Ieff), linear drain current (Idlin), saturation drain current (Idsat), etc., can include, but are not limited to, saturation threshold voltage (Vtsat), charge carrier mobility (u0), carrier saturation velocity, drain-induced barrier lowering (DIBL) and series resistance. The base model 111 can further comprise a model parameter adjuster. The model parameter adjuster is an override factor (also referred to as a constant, such as a multiplier or an adder) that is used within the base model 111 to increase or decrease the value of the model parameter in order to account for relationship between the changes in the model parameter and corresponding changes in the performance attribute and, thereby to compensate for local layout effects (LLEs). For example, for saturation threshold voltage (Vtsat), the model parameter adjuster can be a threshold voltage adder (Vt adder), whereas for charge carrier mobility (u0), the model parameter adjuster can be a mobility multiplier (u0 multiplier).

The design specifications 112 for the IC can include, but are not limited to, an IC design layout 113 that incorporates the transistor. Specifically, the design layout 113 can define, within the design for the IC, placement of the transistor and also placement of a local layout effect (LLE)-inducing feature (see detailed discussion below) adjacent to the transistor channel region. The design layout 113 can further define shapes that extend between sides of the channel region of the transistor and edges of that LLE-inducing feature to illustrate the separation between the channel region and the LLE-inducing feature. Since the present application relates to non-uniform local layout effects (LLEs), at least one of these shapes can be non-uniform (e.g., non-rectangular). Such a non-uniform shape can extend between an essentially linear side of the channel region of the transistor and a non-linear edge of the LLE-inducing feature such that different points on the edge of the LLE-inducing feature are separated from the side of the channel region by different distances, respectively. For example, the edge of the LLE-inducing feature can be serrated, jagged or otherwise non-linear such that it has different sections that are separated from the side of the channel region of the transistor by different distances.

The LLE-inducing feature can comprise, for example, a strain-inducing feature (i.e., a feature that imparts strain on the channel region of the FET). Strain-inducing features can include, for example, stress layer(s) (e.g., a stress layer that overlays the entire FET, discrete stress layers above each of the source/drain regions of the FET, embedded stress layers within each of the source/drain regions of the FET, etc.), which are specifically incorporated into the design layout for the purpose of imparting strain in order to optimize FET performance. Other strain-inducing features can include, for example, isolation regions, spacers, other devices, or other structural components that are incorporated into the design layout for non-stress related purposes, but which by reason of their placement impart strain. Alternatively, the LLE-inducing feature can comprise a feature, such as a well region or other dopant implant region, which exhibits dopant scattering. Alternately, the LLE-inducing feature can comprise a feature that exhibits structural variations due to lithographic patterning variations (e.g., a feature with rounded corners as compared to squared corners indicated in the design layout because of variations that occur during lithographic patterning of the features).

Figure 2:
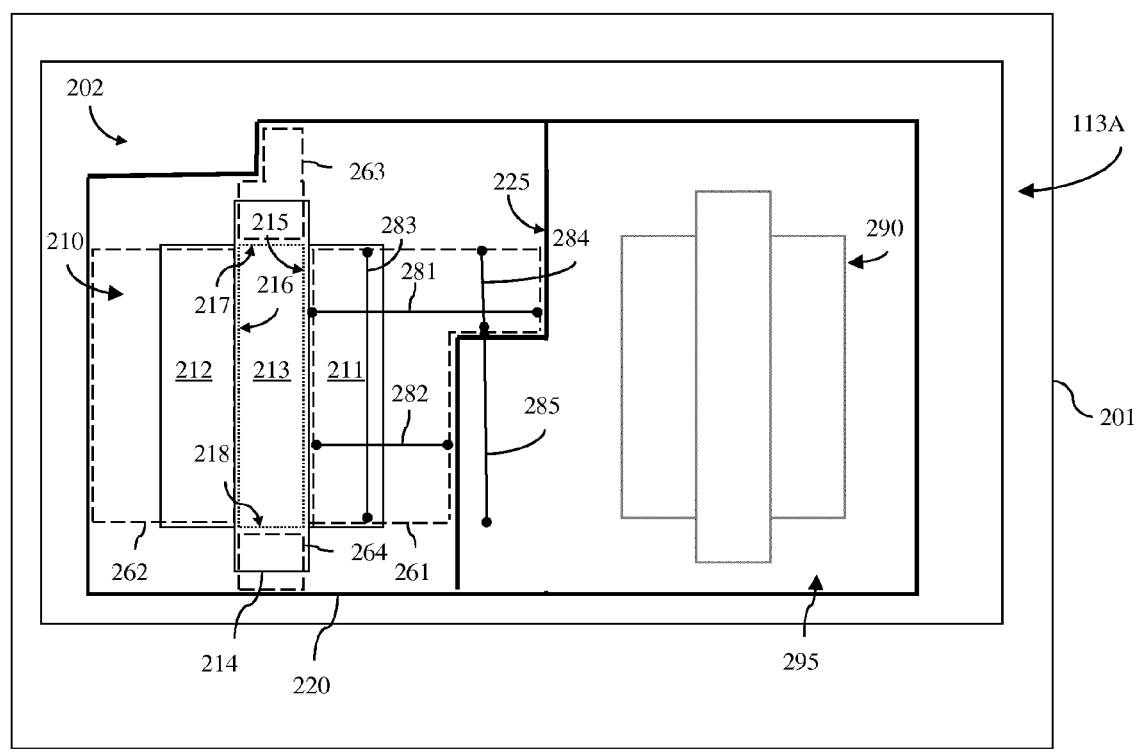
FIG. 2 is a schematic diagram illustrating a portion of an exemplary integrated circuit (IC) design layout showing a transistor and a LLE-inducing feature adjacent to the transistor.
Figure 3:
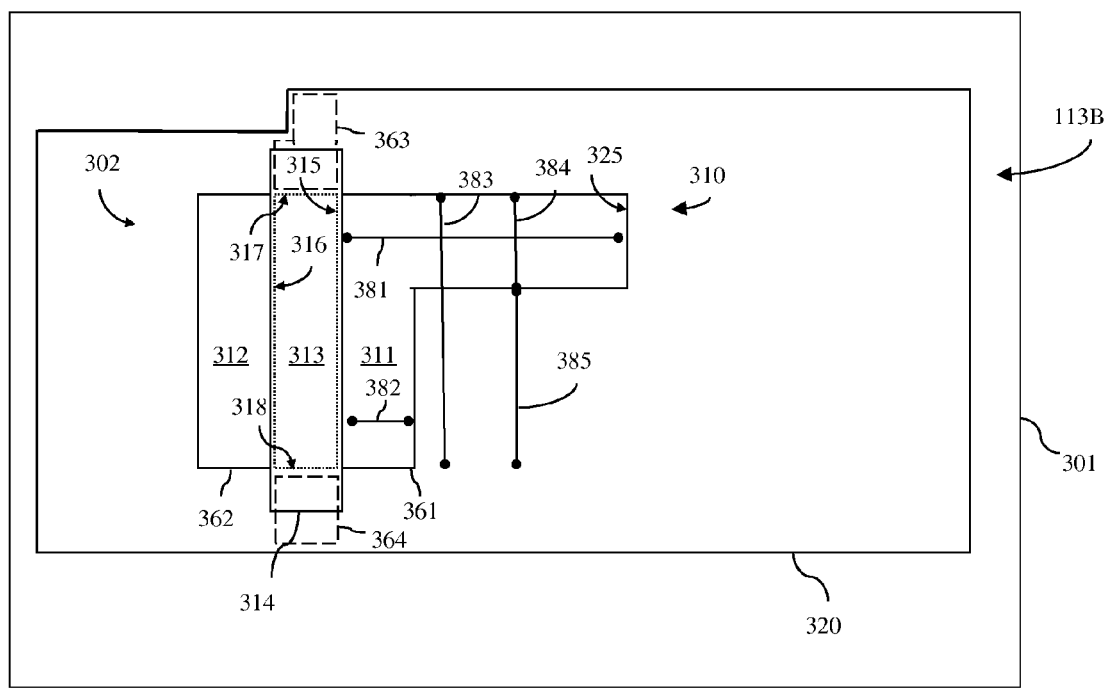
FIG. 3 is a schematic diagram illustrating a portion of another exemplary integrated circuit (IC) design layout showing a transistor and a LLE-inducing feature adjacent to the transistor.

FIGS. 2 and 3 illustrate portions of exemplary IC design layouts 113A and 113B, that define, within an IC on a wafer 201, 301, placement of various shapes including, but not limited to, placement of a FET 210, 310, placement of a LLE-inducing feature 220, 320 (e.g., a strain-inducing feature or other LLE inducing feature) adjacent to the FET 210, 310 channel region and placement of other shapes, including at least one non-uniform shape (e.g., see non-uniform shapes 261 and 263, 361 and 363), that extend between sides of the channel region 213, 313 and edges of the strain-inducing feature 220, 320.

In each of the exemplary IC design layouts 113A, 113B, the FET 210, 310 comprises an active semiconductor region, which is laterally surrounded by a region 202, 302 such as a shallow trench isolation (STI) region or, alternatively, any other suitable isolation region, such as a well region. The active semiconductor region comprises at least a first source/drain region 211, 311, a second source/drain region 212, 312 and a channel region 213, 313 positioned laterally between the first source/drain region 211, 311 and the second source/drain region 212, 312. As illustrated, the channel region 213, 313 of the FET 210, 310 is essentially rectangular in shape with four essentially linear sides 215-218, 315-318, including opposing sides 215-216, 315-316, which are immediately adjacent to and parallel to the first source/drain region 211, 311 and the second source/drain region 212, 312, respectively, and opposing ends 217-218, 317-318, which are perpendicular to the opposing sides 215-216, 315-316. The FET 210, 310 further comprises a gate structure 214, 314 that traverses the channel region 213, 313 between the first and second source/drain regions 211-212, 311-312.

As mentioned above, each of the exemplary IC design layouts 113A and 113B define, within an IC, placement of a LLE-inducing feature 220, 320 adjacent to the FET 210, 310.

For illustration purposes, in the exemplary IC design layout 113A of FIG. 2, the LLE-inducing feature 220 is the perimeter of a stress layer overlaying the FET 210. The design layout 113A further shows that, optionally, this stress layer can abut an additional layer 295. For example, the stress layer can be one of two different types of stress layers (i.e., one of the layers of dual stress layers (DSLs)). Specifically, in the design layout 113A, the FET 210 is positioned laterally adjacent to a second FET 290. The FET 210 can have a different conductivity type than the second FET 290. For example, the FET 210 can comprise an N-type FET (NFET) and the second FET 290 can comprise a P-type FET (PFET). The second FET 290 can be covered by a second stress layer 295 that abuts the stress layer over the FET 210 such that the interface between the two stress layers is positioned laterally between the two FETs 210, 290. In order to optimize the performance of the FET 210, the stress layer over the FET 210 can comprise a first type of stress layer (e.g., a tensile stress layer) and, in order to optimize the performance of the second FET 290, the second stress layer 295 over the second FET 290 can comprise a second type of stress layer (e.g., a compressive stress layer). In the exemplary IC design layout 113B of FIG. 3, the LLE-inducing feature 320 is the perimeter of the region 302, which laterally surrounds the active semiconductor region of the FET 310. As mentioned above, this region can comprise an STI region such that is a strain-inducing feature. Alternatively, this region 302 can comprise a well region that exhibits dopant scattering.

In any case, each of the exemplary IC design layouts 113A, 113B further define shapes 261-262, 361-362 on the opposing sides 215-216, 315-316 of the channel region 213, 313. These shapes 261-262, 361-362 illustrate the separation between the opposing sides 215-216, 315-316 of the channel region 213, 313 of the FET 210, 310 and the LLE-inducing feature 220, 320. The dimensions of these shapes can be analyzed and the results considered in order to determine a value for the model parameter adjuster. As mentioned above, the model parameter adjuster is used within the base model to increase or decrease the value of a model parameter and, thereby to adjust a value of the performance attribute of the FET 210, 310 in order to account for LLEs caused by the LLE-inducing feature. Optionally, each of the exemplary IC design layouts 113A, 113B can further define additional shapes 263-264, 363-364 on the opposing ends 217-218, 317-318 of the channel region 213, 313. The dimensions of these additional shapes 263-264, 363-364 can optionally be analyzed and the results considered to further refine the value of the model parameter adjuster in order to provide even more accuracy to the model.

More specifically, each shape 261-262, 361-362 and, if applicable, each additional shape 263-264, 363-364 extends between one side of the channel region 213, 313 and an edge of the LLE-inducing feature 220, 320. The shapes 261-262, 361-362 each extends from one side of the channel region 213, 313 at an interface with a source/drain region to an edge of the LLE-inducing feature 220, 320. The additional shapes 263-264, 363-365 each specifically extends from one end of the channel region 213, 313 at interface with a STI region or well region to an edge of the LLE-inducing feature 220, 320. It should be noted that, since in the IC design layout 113B, the stress-inducing feature 320 is the perimeter of a STI region or well region that laterally surrounds the semiconductor body, the shapes 361-362 in the design layout 113B correspond to the shapes of the first and second source/drain regions 311-312, respectively.

As mentioned above, in each of the exemplary IC design layouts 113A, 113B at least one of the defined shapes is non-uniform, thereby indicating that the LLE-inducing feature 220, 320 imparts a non-uniform amount of strain across the channel region 213, 313 of the FET 210, 310. Specifically, referring to the exemplary IC design layout 113A of FIG. 2, the shape 261 is non-uniform. It extends between the side 215 of the channel region 213 of the FET 210 and the edge 225 of the LLE-inducing feature 220 (i.e., the stress layer). The side 215 of the channel region 213 is essentially linear. The edge 225 of the LLE-inducing feature 220, which is, optionally, located at an interface with an additional layer 295 (e.g., a second stress layer), is non-linear. Thus, different points on the edge 225 of the LLE-inducing feature 220 are separated from the side 215 of the channel region by different distances 281-282, respectively. That is, the edge 225 of the LLE-inducing feature 220 has different sections that are separated from the side 215 of the channel region 213 by different distances 281-282. In this exemplary IC design layout 113A, the additional shape 263 is also non-uniform, extending between the side 217 of the channel region 213 of the FET 210 and another non-linear edge of the LLE-inducing feature 220 (i.e., the stress layer). Referring to the exemplary IC design layout 113B of FIG. 3, the shape 361 is non-uniform. It extends between the side 315 of the channel region 311 of the FET 310 and the edge 325 of the LLE-inducing feature 320, which in this case is the STI region or well region that laterally surrounds the active semiconductor region of the FET 310. The side 315 of the channel region 313 is essentially linear. The edge 325 of the LLE-inducing feature 320, which is located at an interface between the first source/drain region 311 and the STI or well region adjacent thereto, is non-linear. Thus, different points on the edge 325 of the LLE-inducing feature 320 are separated from the side 315 of the channel region 313 by different distances 381-382, respectively. That is, the edge 325 of the LLE-inducing feature 320 has different sections that are separated from the side 315 by different distances. In this exemplary IC design layout 113B, the additional shape 363 is also non-uniform, extending between the side 317 of the channel region 313 of the FET 310 and another non-linear edge of the LLE-inducing feature 320. For illustration purposes, the non-linear edges of the LLE-inducing feature are shown with only two different sections separated from the channel region by two different distances. However, it should be understood that the modeling technique described in greater detail below can be applied when any of two or more different sections of a non-linear edge of a LLE-inducing feature are separated from a side of the channel region by different distances.

As mentioned above, the computer system 100 can comprise at least one processor. Specifically, the computer system 100 can comprise a single specialized processor 130 (e.g., a single specialized computer processing unit) that, during IC design, performs (i.e., that is adapted to perform, that is configured to perform and/or that executes multiple programs of instructions 115 to perform) multiple process steps, as described in detail below. Alternatively, the computer system 100 can comprise multiple specialized processors 130(a)-(c) (e.g., multiple different specialized computer processing units) and, during IC design, each processor can perform (i.e., can be adapted to perform, can be configured to perform and/or can execute one or more specific programs of instructions 115 to perform) one or more of the multiple process steps, as described in detail below. For purposes of illustration, three different special purpose processor(s) are shown in FIG. 1 including an IC design layout analyzer 130(a), a compact model generator 130(c) and a design editor 130(c). It should be understood that FIG. 1 is not intended to be limiting and, alternatively, the multiple process steps, as described in detail below, can be performed by any number of one or more processors.

Referring to FIG. 1 in combination with FIGS. 2 and 3, the processor 130 (or, if applicable, the IC design layout analyzer 130(a)) can access the IC design layout 113 from the memory 110 and can extract, from the design layout 113, layout information associated with the shapes 261-262, 361-361 on the opposing sides 215-216, 315-316 of the channel region 213, 313 adjacent to the first and second source/drain regions 211-212, 311-312 and, optionally, with the additional shapes 263-264, 363-364 on the opposing ends 217-218, 317-318 of the channel region 213, 313. The processor 130 (or, if applicable, the IC design layout analyzer 130(a)) can analyze this extracted layout information in order determine the value of the model parameter adjuster for the model parameter (e.g., the threshold voltage adder (Vt adder) for the saturation threshold voltage (Vtsat) or the mobility multiplier (u0 multiplier) for the charge carrier mobility (u0)) in the base model 111.

Specifically, the value for the model parameter adjuster in the base model can be calculated based on a sum of contributions from the results of analyses performed with respect to at least the shapes 261-262, 361-361 on opposite sides 215-216, 315-316 of the channel region 213, 313 adjacent to the first and second source/drain regions 211-212, 311-312 and, optionally, based on the sum of contributions from the results of analyses performed with respect to all of the shapes 261-264, 361-364 on all of the sides 215-218, 315-318 of the channel region 213, 313. For example, a base model can indicate that a variation in the effective drive current (ΔIeff) is equal to a variation in the saturation threshold voltage (ΔVtsat) offset by a threshold voltage adder (Vt adder). In this case, the ΔVtsat will increase linearly with the threshold voltage adder (Vt adder) and the variation in the saturation threshold voltage (ΔVtsat) can be determined based on the sum of ΔVtsat contributions associated with at least each of the opposing sides 215-216, 315-316 of the channel region 213, 313. Optionally, for even more accuracy, the variation in the saturation threshold voltage (ΔVtsat) can be determined based on the sum of ΔVtsat contributions associated with all of the sides 215-218, 315-318 of the channel region 213, 313. Similarly, a base model can indicate that a variation in the effective drive current (ΔIeff) (or any other current at issue) can be impacted by a variation in the charge carrier mobility (Δu0). In this case, the variation in the charge carrier mobility (Δu0) will change with changes in the mobility multiplier (u0 multiplier). More specifically, the changes in the effective drive current (ΔIeff) (or any other current at issue) can be computed using an updated mobility value (u0(updated)) that is equal to an original mobility value (u0(original)) plus the Δu0, where Δu0 is equal to u0(original) times the mobility multiplier (u0 multiplier). Thus, the changes in the effective drive current (ΔIeff) (or any other current at issue) can be computed using an updated mobility value (u0 (updated)) that is equal to the original mobility value (u0 (original)) scaled by the factor 1+Δu0/u0(original). Furthermore, the variation in the charge carrier mobility (Δu0) can be determined based on the sum Δu0 contributions associated with at least each of the opposing sides 215-216, 315-316 of the channel region 213, 313. Optionally, for even more accuracy, the variation in the charge carrier mobility (Δu0) can be determined based on the sum of Δu0 contributions associated with all of the sides 215-218, 315-318 of the channel region 213, 313.

Thus, the layout information extracted from the design layout 113 can comprise, among other information, the number of vertices (i.e., corners) associated with each of the shapes 261-262, 361-362 and, optionally, with each of the additional shapes 263-264, 363-364. The number of vertices associated with a given shape can indicate whether that given shape is uniform or non-uniform. For example, four vertices can indicate that the given shape is uniform (i.e., rectangular) and more than four vertices can indicate that the given shape is non-uniform (i.e., non-rectangular).

For any uniform shape (i.e., for any rectangular shape), the corresponding contribution of that uniform shape to the value of the model parameter adjuster will be determined using conventional techniques. That is, for each uniform shape, the layout information extracted from the design layout 113 can further comprise the maximum width of uniform shape, which corresponds to the length of the side of the rectangular channel region at issue, and the total length of the uniform shape, which corresponds to the essentially uniform distance between the side of the channel region at issue and the edge of the LLE-inducing feature opposite that side. The maximum width and the total length can then be used to determine the corresponding contribution of the uniform shape to the value of the model parameter adjuster. Specifically, the LLE impact can be modeled using an empirical relationship C/r, where is C is a calibrating factor and r is the distance between the side of the channel region and the outer edge of a source/drain region, considering a rectangular channel region and a rectangular source/drain region.

However, if, as illustrated in FIGS. 2 and 3, one or more of the shapes on the opposing sides 215-216, 315-316 of the channel region is/are non-uniform shape(s) (e.g., see non-uniform shape 261, 361), the processor 130 (or, if applicable, the IC design layout analyzer 130(a)) can perform more detailed extraction and analysis processes in order to provide a more accurate indication of the non-uniform shape's contribution to the value of the model parameter adjuster. For example, with respect to the non-uniform shape 261, 361, the processor 130 (or, if applicable, the IC design layout analyzer 130(a)) can extract, from the IC design layout, various pieces of layout information associated with that non-uniform shape 261, 361. This layout information can include, but is not limited to, the following: (1) a maximum distance ($d_1$) 281, 381 between the side 215, 315 of the channel region 213, 313 and the edge 225, 325 of the LLE-inducing feature 220, 320; (2) a minimum distance ($d_2$) 282, 382 between the side 215, 315 of the channel region 213, 313 and the edge 225, 325 of the LLE-inducing feature 220, 320; (3) the maximum width (W) 283, 383 of the shape 261, 361; and (4) the total area (A) of the shape 261, 361. The processor 130 (or, if applicable, the IC design layout analyzer 130(a)) can further determine the following, based on the previously extracted layout information: (1) a first width ($w_1$) 284, 384 of a first portion of the shape 261, 361, which is associated with the maximum distance ($d_1$) 281, 381, and a second width ($w_2$) 285, 385 of a second portion of the shape 261, 361, which is associated with the minimum distance ($d_2$) 282, 382. Specifically, the following equations can be used to determine the first width ($w_1$) and second width ($w_2$):

$$w_1 = \frac{(W * d_2 - A)}{(d_2 - d_1)}; \text{and,} \quad (1)$$

$$w_2 = \frac{(A - d_1 * W)}{(d_2 - d_1)}. \quad (2)$$

Next, the corresponding contribution of the non-uniform shape 261, 361 to the value of the model parameter adjuster can be calculated based on the extracted or calculated values for the maximum distance ($d_1$), the first width ($w_1$) associated with that maximum distance ($d_1$), the minimum distance ($d_2$) and the second width ($w_2$) associated with the minimum distance ($d_2$).

For example, given the non-uniform shape 261, 361 on the side 215, 315 of the channel region 213, 313, the ΔVtsat contribution to the value of the threshold voltage adder (Vt_adder) can be broken down into a sum of ΔVtsat contributions associated with the first portion of the shape (i.e., the maximum distance ($d_1$) and first width ($w_1$)) and the second portion of the shape (i.e., the minimum distance ($d_2$) and second width ($w_2$)), using the following equation:

$$\Delta Vtsat_{contribution\ side\ n} = \frac{(w_1 * \Delta Vtsat(d_1) + w_2 * \Delta Vtsat(d_2))}{W}. \quad (3)$$

Similarly, given the non-uniform shape 261, 361 on the side 215, 315 of the channel region 213, 313, the Δu0 contribution to the mobility multiplier (u0 multiplier) can be broken down into a sum of Δu0 contributions associated with the first portion of the shape (i.e., the maximum distance ($d_1$) and first width ($w_1$)) and the second portion of the shape (i.e., the minimum distance ($d_2$) and second width ($w_2$)), using the following equation:

$$\Delta u0_{contribution\ side\ n} = \frac{(w_1 * \Delta u0(d_1) + w_2 * \Delta u0(d_2))}{w}. \quad (4)$$

Thus, the corresponding contribution of any non-uniform shape to the value of the model parameter adjuster will account for functional sensitivities associated with maximum and minimum distances between the linear side of the channel region of the transistor and the non-linear edge of the LLE-inducing feature. That is, this technique accounts for the fact that the LLE associated with the non-uniform shape may be exponentially stronger in areas where the non-linear edge of the LLE-inducing feature is closest to the channel region and vice versa.

Alternatively, for any non-uniform shape and, particularly, for any non-uniform shape wherein the LLE-inducing feature is some feature other than a stress layer, isolation region or well region (as discussed above) or wherein the edge of the LLE-inducing feature has a relatively large number (e.g., 3 or more) of sections separated from the edge of the channel region by different distances, an average distance (d_ave) between the side of the channel region and the non-linear edge of the LLE-inducing feature can be calculated using the following equation:

$$d\_ave = \frac{(w_1 + w_2)}{\left(\frac{w_1}{d_1} + \frac{w_2}{d_2}\right)}. \quad (5)$$

Thus, the average distance (d_ave) is calculated based on the previously extracted or calculated values for the maximum distance ($d_1$), the first width ($w_1$) associated with that maximum distance ($d_1$), the minimum distance ($d_2$) and the second width ($w_2$) associated with the minimum distance ($d_2$) and not based on any other intermediate distance(s) between the maximum distance ($d_1$) and the minimum distance ($d_2$). Once the average distance (d_ave) is calculated, it can then be used to calculate the corresponding contribution of the non-uniform shape to the value of the model parameter adjuster using the empirical relationship discussed above, which covers many types of local layout effects. In this empirical relationship, the variation in the model parameter (e.g., ΔVtsat, Δu0, etc. as appropriate) will be equal to constant (C)/distance (r), where distance (r) is d1, d2 or d_avg, depending on the situation.

Once the corresponding contributions of the shapes 261-262, 361-361 on the opposing sides 215-216, 315-316 of the channel region 213, 313 of the transistor 210, 310 and, optionally, the corresponding contributions of the additional shapes 263-264, 363-364 on the opposing ends 217-218, 317-318 of the channel region 213, 313 are determined, they can be added together to determine the value of model parameter adjuster for the model parameter at issue within the base model 111 (e.g., the threshold voltage adder (Vt adder) for the saturation threshold voltage (Vtsat) or the mobility multiplier (u0 multiplier) for the charge carrier mobility (u0)).

Next, the processor 130 (or, if applicable, the IC compact model generator 130(b)) can generate a compact model 114 and store the compact model 114 in the memory 110. This compact model 114 can be generated to model the performance attribute (e.g., the effective drive current (Ieff)) of the transistor within the IC. Specifically, this compact model 114 can be generated using the base model 111 and setting the value of the model parameter adjuster to previously calculated value. Thus, the compact model 114 takes into consideration the local layout effect (LLE), including any non-uniform LLE, from the LLE-inducing feature on the channel region of the transistor.

Once the compact model 114 is generated and stored in memory 110, the processor 130 (or, if applicable, the design editor 130(c)) can use the compact model 114 to determine whether or not the transistor will meet a performance specification required by the IC and can further perform layout-aware IC redesign, as necessary. Specifically, if the compact model indicates that the performance attribute of the transistor will not meet a performance specification required for the IC, the processor 130 (or, if applicable, the design editor 130(c)) can redesign the IC so that the performance specification is met. The IC can be redesigned, for example, by replacing the transistor with a substitute transistor in order to meet the performance specification. Additionally or alternatively, the IC can be redesign by adjusting the design layout and, particularly, the placement of the transistor (or substitute transistor) relative to the placement of the LLE-inducing feature in order to meet the performance specification. Adjustment of the placement of the transistor (or substitute transistor) relative to the placement of the LLE-inducing feature can include, for example, selectively adjusting the distance(s) between each side of the channel region and adjacent edges (or sections of the adjacent edges) of the LLE-inducing feature in order to selectively adjust the performance attribute.

The processor 130 (or, if applicable, the IC design layout analyzer 130(a), the compact model generator 130(b) and the design editor 130(c)) can iteratively repeat the above-described processes in order to generate a final design for the IC and, particularly, a final design layout for the IC. Once the final design layout is generated, the IC can be manufactured according to that final design layout.

Figure 4:
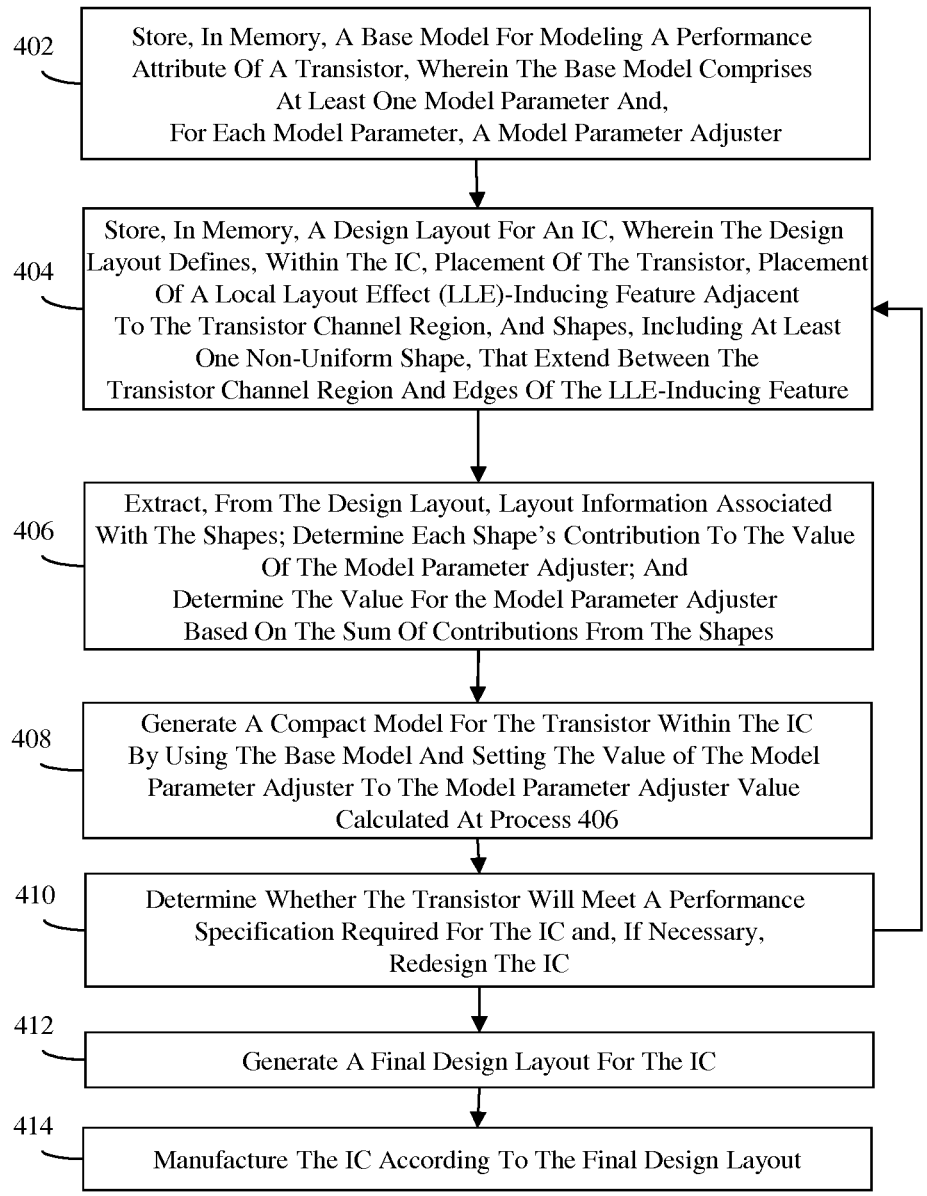
FIG. 4 is a flow diagram illustrating a method for modeling a performance attribute of a transistor within an integrated circuit (IC) and for performing layout-aware redesign.

Referring to the flow diagram of FIG. 4 in combination with the computer system diagram of FIG. 1, also disclosed herein is a method for modeling a performance attribute of a transistor within an integrated circuit (IC) and performing layout-aware redesign, as necessary.

The method can comprise storing, in at least one memory 110, a base model 111 for a transistor (e.g., a field effect transistor (FET)) and design specifications 112 for an integrated circuit (IC) that incorporates the transistor (402)-(404).

The base model 111 can model a performance attribute of the transistor. The performance attribute can comprise, for example, effective drive current (Ieff), linear drain current (Idlin), saturation drain current (Idsat) or any other performance attribute of a transistor that may be impacted by LLEs. The base model 111 can comprise at least one model parameter and can indicate that changes in the value of this model parameter can result in corresponding changes in the value of the performance attribute. Exemplary model parameters that can impact a performance attribute, such as effective drive current (Ieff), linear drain current (Idlin), saturation drain current (Idsat), etc., can include, but are not limited to, saturation threshold voltage (Vtsat), charge carrier mobility (u0), carrier saturation velocity, drain-induced barrier lowering (DIBL) and series resistance. The base model 111 can further comprise a model parameter adjuster. The model parameter adjuster is an override factor (also referred to as a constant, such as a multiplier or an adder) that is used within the base model 111 to increase or decrease the value of the model parameter in order to account for relationship between the changes in the model parameter and corresponding changes in the performance attribute and, thereby to compensate for local layout effects (LLEs). For example, for saturation threshold voltage (Vtsat), the model parameter adjuster can be a threshold voltage adder (Vt adder), whereas for charge carrier mobility (u0), the model parameter adjuster can be a mobility multiplier (u0 multiplier). Other model parameters that can impact the performance attributed can include, but are not limited to, drain-induced barrier lowering (DIBL) and series resistance.

The design specifications 112 for the IC can include, but are not limited to, an IC design layout 113 that incorporates the transistor. Specifically, the design layout 113 can define, within the design for the IC, placement of the transistor and also placement of a local layout effect (LLE)-inducing feature (see detailed discussion below) adjacent to the transistor channel region. The design layout 113 can further define shapes that extend between sides of the channel region of the transistor and edges of that LLE-inducing feature to illustrate the separation between the channel region and the LLE-inducing feature. Since the present application relates to non-uniform local layout effects (LLEs), at least one of these shapes can be non-uniform (e.g., non-rectangular). Such a non-uniform shape can extend between an essentially linear side of the channel region of the transistor and a non-linear edge of the LLE-inducing feature such that different points on the edge of the LLE-inducing feature are separated from the side of the channel region by different distances, respectively. For example, the edge of the LLE-inducing feature can be serrated, jagged or otherwise non-linear such that it has different sections that are separated from the side of the channel region of the transistor by different distances.

As discussed in detail above, the LLE-inducing feature can comprise, for example, a strain-inducing feature (i.e., a feature that imparts strain on the channel region of the FET). Strain-inducing features can include, for example, stress layer(s) (e.g., a stress layer that overlays the FET, a stress liner that lines the source/drain regions of the FET, an embedded stress layer within the source/drain regions of the FET, etc.), which are specifically incorporated into the design layout for the purpose of imparting strain in order to optimize FET performance. Other strain-inducing features can include, for example, isolation regions, spacers, other devices, or other structural components that are incorporated into the design layout for non-stress related purposes, but which by reason of their placement impart strain. Alternatively, the LLE-inducing feature can comprise a feature, such as a well region or other dopant implant region, which exhibits dopant scattering. Alternately, the LLE-inducing feature can comprise a feature that exhibits structural variations due to lithographic patterning variations (e.g., a feature with rounded corners as compared to squared corners indicated in the design layout because of variations that occur during lithographic patterning of the features).

FIGS. 2 and 3 illustrate portions of exemplary IC design layouts 113A and 113B, that define, within an IC on a wafer 201, 301, placement of various shapes including, but not limited to, placement of a FET 210, 310, placement of a LLE-inducing feature 220, 320 (e.g., a strain-inducing feature or other LLE-inducing feature) adjacent to the FET 210, 310 channel region and placement of other shapes, including at least one non-uniform shape (e.g., see non-uniform shapes 261 and 263, 361 and 363), that extend between sides of the channel region 213, 313 and edges of the LLE-inducing feature 220, 320.

The method can further comprise accessing (e.g., by at least one processor 130 from the memory 110) the design layout 113 and the base model 111. The method can further comprise performing (e.g., by the at least one processor 130) the following process steps using the design layout 113 and the base model 111. It should be noted that the process steps are described below with reference to the exemplary IC design layouts 113A and 113B of FIGS. 2 and 3, respectively.

Specifically, the method can comprise extracting, from the design layout 113, layout information associated with the shapes 261-262, 361-361 on the opposing sides 215-216, 315-316 of the channel region 213, 313 adjacent to the first and second source/drain regions 211-212, 311-312 and, optionally, with the additional shapes 263-264, 363-364 on the opposing ends 217-218, 317-318 of the channel region 213, 313; analyzing this extracted layout information and, based on the results of such analyzing, determining the value of the model parameter adjuster for the model parameter (e.g., the threshold voltage adder (Vt adder) for the saturation threshold voltage (Vtsat) or the mobility multiplier (u0 multiplier) for the charge carrier mobility (u0)) in the base model 111 (406). At process 406, the value of the model parameter adjuster for the model parameter in the base model 111 can specifically be calculated based on a sum of contributions from the results of analyses performed with respect to at least the shapes 261-262, 361-361 on opposite sides 215-216, 315-316 of the channel region 213, 313 adjacent to the first and second source/drain regions 211-212, 311-312 and, optionally, based on the sum of contributions from the results of analyses performed with respect to all of the shapes 261-264, 361-364 on all of the sides 215-218, 315-318 of the channel region 213, 313.

Thus, at process 406, the layout information extracted from the design layout 113 can comprise the number of vertices (i.e., corners) associated with each of the shapes 261-262, 361-362 and, optionally, with each of the additional shapes 263-264, 363-364. The number of vertices associated with a given shape can indicate whether that given shape is uniform or non-uniform. For example, four vertices can indicate that the given shape is uniform (i.e., rectangular) and more than four vertices can indicate that the given shape is non-uniform (i.e., non-rectangular).

Additionally, at process 406, for any uniform shape (i.e., for any rectangular shape), the corresponding contribution of that uniform shape to the value of the model parameter adjuster can be determined using conventional techniques. That is, for each uniform shape (e.g., see uniform shape 262, 363), the layout information extracted from the design layout 113 can further comprise the maximum width of the uniform shape, which corresponds to the length of the side of the channel region at issue, and the total length of the uniform shape, which corresponds to the essentially uniform distance between the side of the channel region at issue and the edge of the LLE-inducing feature opposite that side. The maximum width and the total length can then be used to determine the corresponding contribution of the uniform shape to the value of the model parameter adjuster, as described in greater detail above with regard to the system 100.

Figure 5:
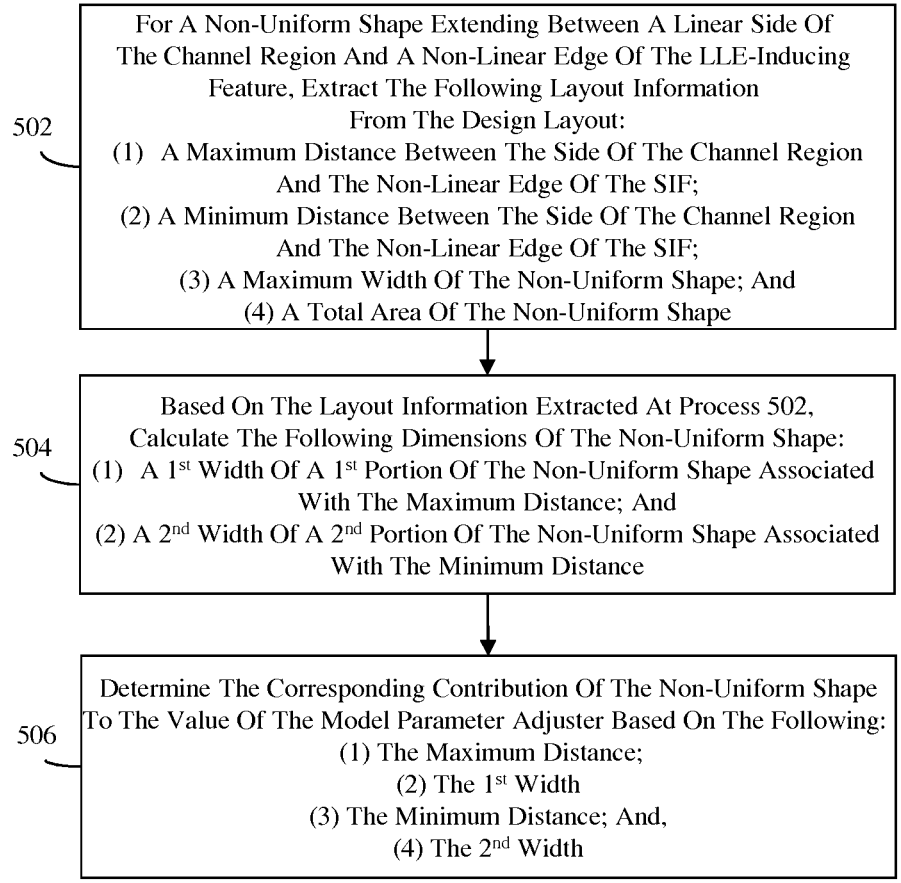
FIG. 5 is a flow diagram further illustrating process 406 of FIG. 4.

However, if, as illustrated in FIGS. 2 and 3, one or more of the shapes on the opposing sides 215-216, 315-316 of the channel region is/are non-uniform shape(s) (e.g., see non-uniform shape 261, 361), more detailed extraction and analyses processes, as set forth in the flow diagram of FIG. 5, can be performed at process 406 in order to provide a more accurate indication of that non-uniform shape's contribution to the value of the model parameter adjuster. Specifically, referring to FIG. 5 and considering the non-uniform shape 261, 361, various pieces of layout information associated with that non-uniform shape 261, 361 can be extracted from the design layout (502). This layout information can include, but is not limited to, the following: (1) a maximum distance ($d_1$) 281, 381 between the side 215, 315 of the channel region 213, 313 and the edge 225, 325 of the LLE-inducing feature 220, 320; (2) a minimum distance ($d_2$) 282, 382 between the side 215, 315 of the channel region 213, 313 and the edge 225, 325 of the LLE-inducing feature

220, 320; (3) the maximum width (W) 283, 383 of the shape 261, 361; and (4) the total area (A) of the shape 261, 361. Then, based on the previously extracted layout information, the following dimensions associated with the shape 261, 361 can be calculated: (1) a first width ($w_1$) 284, 384 of a first portion of the shape 261, 361, which is associated with the maximum distance ($d_1$) 281, 381, and a second width ($w_2$) 285, 385 of a second portion of the shape 261, 361, which is associated with the minimum distance ($d_2$) 282, 382 (504). Specifically, equations (1) and (2) above can be used to determine the first width ($w_1$) and second width ($w_2$) of the non-uniform shape 261, 361. Then, the corresponding contribution of this non-uniform shape 261, 361 to the value of the model parameter adjuster can be calculated based on the extracted or calculated values for the maximum distance ($d_1$), the first width ($w_1$) associated with that maximum distance ($d_1$), the minimum distance ($d_2$) and the second width ($w_2$) associated with the minimum distance ($d_2$), as shown equations (3) and (4) and described in greater detail above with regard to the system 100 (506). Thus, the corresponding contribution of any non-uniform shape to the value of the model parameter adjuster will account for functional sensitivities associated with maximum and minimum distances between the linear side of the channel region of the transistor and the non-linear edge of the LLE-inducing feature. That is, this technique accounts for the fact that the LLE associated with the non-uniform shape may be exponentially stronger in areas where the non-linear edge of the LLE-inducing feature is closest to the channel region and vice versa.

Alternatively, for any non-uniform shape and, particularly, for any non-uniform shape wherein the LLE-inducing feature is some feature other than a stress layer, isolation region or well region (as discussed above) or wherein the edge of the LLE-inducing feature has a relatively large number (e.g., 3 or more) of sections separated from the edge of the channel region by different distances, an average distance (d_ave) between the side of the channel region and the non-linear edge of the LLE-inducing feature can be calculated using equation (5) above. This average distance (d_ave) can then used to determine the corresponding contribution of the non-uniform shape to the value of the model parameter adjuster, as described in greater detail above with regard to the system 100.

The corresponding contributions of the shapes 261-262, 361-361 on the opposing sides 215-216, 315-316 of the channel region 213, 313 of the transistor 210, 310 and, optionally, the corresponding contributions of the additional shapes 263-264, 363-364 on the opposing ends 217-218, 317-318 of the channel region 213, 313 can all be added together at process 406 in order to determine the value of model parameter adjuster for the model parameter at issue in the base model 111 (e.g., the threshold voltage adder (Vt adder) for the saturation threshold voltage (Vtsat) or the mobility multiplier (u0 multiplier) for the charge carrier mobility (u0)).

Referring again to FIG. 4, once the value for the model parameter adjuster for the model parameter in the base model 111 is calculated (e.g., once the threshold voltage adder (Vt adder) for the saturation threshold voltage (Vtsat) or the mobility multiplier (u0 multiplier) for the charge carrier mobility (u0) is calculated), a compact model 114 can be generated and stored in memory 110 (408). Specifically, a compact model 114 can be generated at process 408 to model the performance attribute (e.g., effective drive current (Ieff)) of the transistor within the IC. This compact model 114 can be generated at process 408 using the base model 111 and setting the value of the model parameter adjuster for the model parameter to the value calculated at process 406. Thus, the compact model takes into consideration the local layout effect (LLE), including any non-uniform LLE, from the LLE-inducing feature on the channel region of the transistor.

Once the compact model 114 is generated and stored in memory 110, the compact model 114 can be used to make a determination regarding whether or not the transistor will meet a performance specification required by the IC and, if necessary, the IC can be redesigned (410). Specifically, if the compact model indicates that the performance attribute of the transistor will not meet a performance specification required for the IC, the IC can be redesign so that the performance specification is met. The IC can be redesigned, for example, by replacing the transistor with a substitute transistor in order to meet the performance specification. Additionally or alternatively, the IC can be redesign by adjusting the design layout and, particularly, the placement of the transistor (or substitute transistor) relative to the placement of the LLE-inducing feature in order to meet the performance specification. Adjustment of the placement of the transistor (or substitute transistor) relative to the placement of the LLE-inducing feature can include, for example, selectively adjusting the distance(s) between each side of the channel region and adjacent edges (or sections of the adjacent edges) of the LLE-inducing feature in order to selectively adjust the performance attribute.

The process steps 404-410 can be iteratively repeated until performance specifications for the IC are met. Then, a final design for the IC and, particularly, a final design layout for the IC can be generated (412). Once the final design layout is generated at process 412, the IC can be manufactured according to that final design layout (414).

Also disclosed herein are embodiments of a computer program product. This computer program product can comprise a computer readable storage medium having program instructions embodied therewith. The program instructions can be executable by a processor to cause the processor to perform the above-described method for modeling for modeling a performance attribute of a transistor within an integrated circuit (IC) and performing layout-aware redesign, as necessary. More specifically, the present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 6:
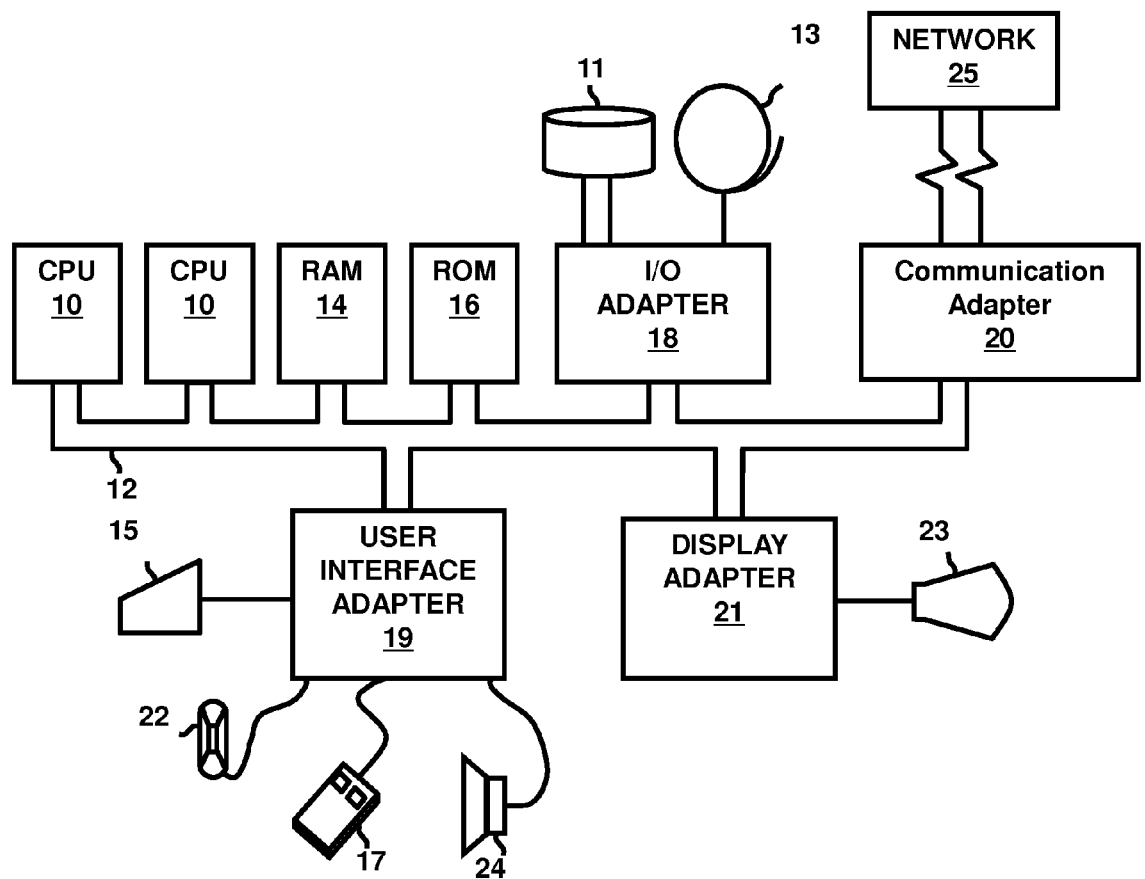
FIG. 6 is schematic diagram illustrating a representative hardware environment for implementing the systems, methods and computer program products disclosed herein.

A representative hardware environment (i.e., a computer system) for implementing the systems, methods and computer program products described above is depicted in FIG. 6. This schematic drawing illustrates a hardware configuration of an information handling/computer system in accordance with the embodiments herein. The system comprises at least one processor or central processing unit (CPU) 10. The CPUs 10 are interconnected via a system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the terminology used herein is for the purpose of describing the disclosed [systems, methods and computer program products] and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

Therefore, disclosed above are embodiments of a system, a method and a computer program product. In the embodiments, a design layout of an integrated circuit (IC) can define a transistor, a local layout effect (LLE)-inducing feature (e.g., a strain-inducing feature or other LLE-inducing feature) adjacent to the transistor and shapes, including at least one non-uniform shape, that illustrate separation between the channel region and the LLE-inducing feature. Layout information associated with the non-uniform shape, including minimum and maximum distances between the channel region and the LLE-inducing feature, can be extracted from the design layout. Based on this layout information, a first width of a first portion of the non-uniform shape, which is associated with the maximum distance, and a second width of a second portion of the non-uniform shape, which is associated with the minimum distance, can be derived and used to calculate the contribution of that non-uniform shape to the value for a model parameter adjuster for a model parameter in a base model. The value of the model parameter adjuster can be calculated based on the sum of the contributions from each of the shapes. A compact model that models the performance attribute of the transistor within the IC can then be generated using the base model with the model parameter adjuster set to the previously calculated value. Modeling the performance attribute in this manner accounts for the fact that the local layout effect (LLE) on the transistor channel region may be exponentially stronger in areas where the LLE-inducing feature is closest to the transistor channel region and vice versa. The compact model can then be used to perform LLE-aware redesign of the IC, as necessary.

The disclosed modeling technique is more accurate than conventional modeling techniques because the calculated contribution of the non-uniform shape to the value of the model parameter adjuster accounts for functional sensitivities associated with different distances between the side of the transistor channel region and the non-linear edge of a LLE-inducing feature. The disclosed modeling technique is also very efficient in that it simply relies on the minimum and maximum distances between the side of the transistor channel region and the non-linear edge of the LLE-inducing feature to determine the contribution of the non-uniform shape to the value of the model parameter adjuster even when two or more distances separate the side of the channel region and the non-linear edge of the LLE-inducing feature (i.e., even when the non-linear edge has multiple jogs or serrations).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system comprising:
   a memory storing a base model and a design layout,
      the base model being for modeling a performance attribute of a transistor comprising a channel region and source/drain regions on opposing sides of the channel region, the base model comprising a model parameter and a model parameter adjuster for the model parameter,
      the design layout being for a specific integrated circuit having specific performance specifications and defining, within a design of the integrated circuit, placement of the transistor, placement of a local layout effect-inducing feature adjacent to the transistor and a shape that is non-uniform and that extends between a side of the channel region and an edge of the local layout effect-inducing feature, the side of the channel region being at an interface between the channel region and a source/drain region,
      the edge of the local layout effect-inducing feature being non-linear such that different points on the edge are separated from the side by different distances; and,
   a processor accessing the base model and the design layout from the memory,
      the processor extracting layout information from the design layout, the layout information comprising at least a minimum distance between the side and the edge, a maximum distance between the side and the edge, a maximum width of the shape as measured in a direction parallel to the side and an area of the shape,
      the processor further determining a first width of a first portion of the shape associated with the maximum distance and a second width of a second portion of the shape associated with the minimum distance, based on the layout information,
      the processor further calculating a value for the model parameter adjuster, based on the maximum distance, the first width, the minimum distance and the second width,
      the processor further using the base model with the model parameter adjuster set at the value to generate a compact model that models the performance attribute of the transistor within the integrated circuit, and
      when the compact model indicates that the transistor will not meet a performance specification of the integrated circuit, the processor redesigning the integrated circuit to ensure that the performance specification will be met.

2. The system of claim 1, the local layout effect-inducing feature comprising any of a strain-inducing feature, a feature that exhibits dopant scattering and a feature that exhibits structural variations due to lithographic patterning variations.

3. The system of claim 2, the strain-inducing feature comprising a stress layer comprising any of a stress overlayer over the transistor, embedded stress layers within source/drain regions of the transistor and discrete stress layers above the source/drain regions.

4. The system of claim 1, the performance attribute comprising any of effective drive current effective drive current (Ieff), linear drain current (Idlin), and saturation drain current (Idsat).

5. The system of claim 1, the model parameter comprising one of mobility and saturation threshold voltage and the model parameter adjuster comprising one of a mobility multiplier and a threshold voltage adder, respectively.

6. The system of claim 1,
the redesigning of the integrated circuit comprising one of the following:
replacing the transistor with a substitute transistor that meets the performance specification; and
adjusting placement of the transistor within the design layout relative to placement of the local layout effect-inducing feature so that the transistor meets the performance specification, and
the redesigning of the integrated circuit further comprising generating a final design layout, wherein the final design layout is used to manufacture the integrated circuit.

7. The system of claim 1, the local layout effect-inducing feature comprising a stress layer overlaying the transistor and the edge being at an interface between the stress layer and an additional layer.

8. The system of claim 1,
the transistor comprising an active semiconductor region comprising a first source/drain region, a second source/drain region and the channel region positioned laterally between the first source/drain region and the second source/drain region,
the local layout effect-inducing feature comprising any one of an isolation region and a well region positioned laterally around and immediately adjacent to the active semiconductor region, and
the edge being at an interface between the first source/drain region and the one of the isolation region and the well region.

9. The system of claim 1, the processor further determining an average distance between the side and the edge, based on the maximum distance, the minimum distance, the first width and the second width.

10. The system of claim 1, the layout information further comprising a number of vertices in the shape.

11. A method comprising:
accessing, by a processor from a memory, a base model and a design layout stored in the memory,
the base model being for modeling a performance attribute of a transistor comprising a channel region and source/drain regions on opposing sides of the channel region, the base model comprising a model parameter and a model parameter adjuster for the model parameter,
the design layout being for a specific integrated circuit having specific performance specifications and defining, within a design for the integrated circuit, placement of the transistor, placement of a local layout effect-inducing feature adjacent to the transistor and a shape that is non-uniform and that extends between a side of the channel region and an edge of the local layout effect-inducing feature, the side of the channel region being at an interface between the channel region and a source/drain region, and
the edge of the local layout effect-inducing feature being non-linear such that different points on the edge are separated from the side by different distances;
extracting, by the processor from the design layout, layout information comprising at least a minimum distance between the side and the edge, a maximum distance between the side and the edge, a maximum width of the shape as measured in a direction parallel to the side and an area of the shape;
based on the layout information, determining, by the processor, a first width of a first portion of the shape associated with the maximum distance and a second width of a second portion of the shape associated with the minimum distance;
based on the maximum distance, the first width, the minimum distance and the second width, calculating, by the processor, a value for the model parameter adjuster;
using, by the processor, the base model with the model parameter adjuster set at the value to generate a compact model that models the performance attribute of the transistor within the integrated circuit; and
when the compact model indicates that the transistor will not meet a performance specification of the integrated circuit, redesigning, by the processor, the integrated circuit to ensure that the performance specification will be met.

12. The method of claim 11, the local layout effect-inducing feature comprising any of a strain-inducing feature, a feature that exhibits dopant scattering and a feature that exhibits structural variations due to lithographic patterning variations.

13. The method of claim 12, the strain-inducing feature comprising a stress layer comprising any of a stress overlayer over the transistor, embedded stress layers within source/drain regions of the transistor and discrete stress layers above the source/drain regions.

14. The method of claim 11, the performance attribute comprising any of effective drive current effective drive current (Ieff), linear drain current (Idlin), and saturation drain current (Idsat).

15. The method of claim 11, the model parameter comprising one of mobility and saturation threshold voltage and the model parameter adjuster comprising one of a mobility multiplier and a threshold voltage adder, respectively.

16. The method of claim 11,
the redesigning of the integrated circuit comprising one of the following:
replacing the transistor with a substitute transistor that meets the performance specification; and
adjusting placement of the transistor within the design layout relative to placement of the local layout effect-inducing feature so that the transistor meets the performance specification,
the redesigning further comprising generating a final design layout, wherein the final design layout is used to manufacture the integrated circuit.

17. The method of claim 11, the local layout effect-inducing feature comprising a stress layer overlaying the transistor and the edge being at an interface between the stress layer and an additional layer.

18. The method of claim 11,
the transistor comprising an active semiconductor region comprising a first source/drain region, a second source/drain region and the channel region positioned laterally between the first source/drain region and the second source/drain region,
the local layout effect-inducing feature comprising any one of an isolation region and a well region positioned laterally around and immediately adjacent to the active semiconductor region, and
the edge being at an interface between the first source/drain region and the one of the isolation region and the well region.

19. The method of claim 11, further comprising determining an average distance between the side and the edge, based on the maximum distance, the minimum distance, the first width and the second width.

20. A computer program product comprising a computer readable storage medium having program instructions embodied therewith, the program instructions being executable by a processor to cause the processor to perform a method, the method comprising:
 accessing, from a memory, a base model and a design layout,
  the base model being for modeling a performance attribute of a transistor comprising a channel region and source/drain regions on opposing sides of the channel region, the base model comprising a model parameter and a model parameter adjuster for the model parameter,
  the design layout being of a specific integrated circuit having specific performance specifications and defining, within a design for the integrated circuit, placement of the transistor, placement of a local layout effect-inducing feature adjacent to the transistor and a shape that is non-uniform and that extends between a side of the channel region and an edge of the local layout effect-inducing feature, the side of the channel region being at an interface between the channel region and a source/drain region, and
  the edge of the local layout effect-inducing feature being non-linear such that different points on the edge are separated from the side by different distances;
 extracting, from the design layout, layout information comprising at least a minimum distance between the side and the edge, a maximum distance between the side and the edge, a maximum width of the shape and an area of the shape;
 based on the layout information, determining a first width of a first portion of the shape associated with the maximum distance and a second width of a second portion of the shape associated with the minimum distance;
 based on the maximum distance, the first width, the minimum distance and the second width, calculating a value for the model parameter adjuster;
 using the base model with the model parameter adjuster set at the value to generate a compact model that models the performance attribute of the transistor within the integrated circuit; and
 when the compact model indicates that the transistor will not meet a performance specification of the integrated circuit, redesigning the integrated circuit to ensure that the performance specification will be met.

* * * * *